US010678573B2

(12) United States Patent
Shah et al.

(10) Patent No.: US 10,678,573 B2
(45) Date of Patent: Jun. 9, 2020

(54) SYSTEM AND METHOD FOR SIMULATING VIRTUAL MACHINE (VM) PLACEMENT IN VIRTUAL DATACENTERS

(71) Applicant: VMware, Inc., Palo Alto, CA (US)

(72) Inventors: Parth Shah, Mountain View, CA (US); Pradeep Padala, Sunnyvale, CA (US); Badhrinath Sampathkumar, Sunnyvale, CA (US)

(73) Assignee: VMware, Inc., Palo Alto, CA (US)

( * ) Notice: Subject to any disclaimer, the term of this patent is extended or adjusted under 35 U.S.C. 154(b) by 1213 days.

(21) Appl. No.: 14/312,599

(22) Filed: Jun. 23, 2014

(65) Prior Publication Data

US 2015/0370583 A1    Dec. 24, 2015

(51) Int. Cl.
| | |
|---|---|
| G06F 9/455 | (2018.01) |
| G06F 9/54 | (2006.01) |
| G06F 9/50 | (2006.01) |
| G06F 30/20 | (2020.01) |

(52) U.S. Cl.
CPC .......... *G06F 9/455* (2013.01); *G06F 9/45533* (2013.01); *G06F 9/45558* (2013.01); *G06F 9/5061* (2013.01); *G06F 9/542* (2013.01); *G06F 30/20* (2020.01); *G06F 2009/4557* (2013.01)

(58) Field of Classification Search
CPC ...... G06F 9/455; G06F 9/45558; G06F 9/541; G06F 17/5009; G06F 9/45533; G06F 2009/4557
USPC .......................................................... 703/22
See application file for complete search history.

(56) References Cited

U.S. PATENT DOCUMENTS

| | | | | |
|---|---|---|---|---|
| 2008/0288505 | A1* | 11/2008 | Dillenberger | ........... H04L 41/50 |
| 2013/0318521 | A1* | 11/2013 | Monaghan | ............ H04L 63/107 |
| | | | | 718/1 |
| 2014/0075029 | A1* | 3/2014 | Lipchuk | .................. G06F 9/505 |
| | | | | 709/226 |

OTHER PUBLICATIONS

VMware Virtual Center; http://www.vmware.com/products/vcenter-server/; accessed Jun. 23, 2014.
Gulati et al.; "VMware Distributed Resource Management: Design, Implementation, and Lessons Learned"; In VMware Technical Journal, Mar. 2012.
Sachin Manpathak, Ajay Gulati, and Mustafa Uysal; "Storage DRS: Automated Management of Storage Devices In a Virtualized Datacenter"; VMware Tech Technical Journal, Dec. 2012.
The Software-Defined Datacenter; http://www.vmware.com/software-defined-datacenter/index.html; accessed Jun. 23, 2014.
Gulati et al.; "dweights: Taming the Multi-Headed Monster for VM Placement in the Cloud"; In RADIO, 2011.

\* cited by examiner

*Primary Examiner* — Saif A Alhija
(74) *Attorney, Agent, or Firm* — Loza & Loza, LLP

(57) ABSTRACT

A placement simulator is used for testing a placement engine in a virtual machine environment. The placement simulator includes a simulation controller, an event manager, and an inventory manager. The simulation controller receives input data for a simulated datacenter. The event manager invokes event handlers for a sequence of events from the input data. The inventory manager stores states of inventory objects to simulate deployment of virtual infrastructure resources by the placement engine based on the sequence of the events.

19 Claims, 12 Drawing Sheets

144

```xml
<TEMPLATES>
  <Entities>
    <Host name="default_host">
      <cpu>1000</cpu>
      <mem>1000</mem>
      <version>7</version>
      <cpuNum>8</cpuNum>
    </Host>
    <Host name="slow_host">
      <cpu>100</cpu>
      <mem>100</mem>
      <version>7</version>
      <cpuNum>4</cpuNum>
    </Host>
    <Host name="fast_host">
      <cpu>10000</cpu>
      <mem>10000</mem>
      <version>7</version>
      <cpuNum>32</cpuNum>
    </Host>
    <Datastore name="default_datastore">
      <storage>1000000</storage>
      <profile>STORAGE_PROFILE_SILVER</profile>
    </Datastore>
    <Datastore name="default_gold_datastore">
      <storage>1000000</storage>
      <profile>STORAGE_PROFILE_GOLD</profile>
    </Datastore>
    <Datastore name="small_datastore">
      <storage>100000</storage>
      <profile>STORAGE_PROFILE_SILVER</profile>
    </Datastore>
    <Datastore name="large_datastore">
      <storage>10000000</storage>
      <profile>STORAGE_PROFILE_SILVER</profile>
    </Datastore>
  </Entities>
</TEMPLATES>
```

```xml
<CLOUD>
  <DATASTORES>
    <Datastore name="datastoreNormal" template="default_datastore"/>
    <Datastore name="datastoreSmall" template="small_datastore"/>
    <Datastore name="datastoreLarge" template="large_datastore"/>
  </DATASTORES>
  <CLUSTERS>
    <Cluster name="clusterNormal">
      <Hosts>
        <Host name="hostNormal" template="default_host" number="3"/>
      </Hosts>
    </Cluster>
    <Cluster name="clusterFast">
      <Hosts>
        <Host name="hostFast" template="fast_host" number="3"/>
      </Hosts>
    </Cluster>
    <Cluster name="clusterSlow">
      <Hosts>
        <Host name="hostSlow" template="slow_host" number="3"/>
      </Hosts>
    </Cluster>
  </CLUSTERS>
  <CONNECTIONS>
    <Connection>
      <Cluster ref="clusterNormal"/>
      <Datastore ref="datastoreNormal"/>
    </Connection>
    <Connection>
      <Cluster ref="clusterFast"/>
      <Datastore ref="datastoreSmall"/>
    </Connection>
    <Connection>
      <Cluster ref="clusterSlow"/>
      <Datastore ref="datastoreLarge"/>
    </Connection>
  </CONNECTIONS>
</CLOUD>
```

```xml
<SCENARIOS>
  <Events>
    <Event timestamp="10">
      <vm name="vmList1" number="3">
        <cpu>1000</cpu>
        <mem>1000</mem>
        <cpuLimit>900</cpuLimit>
        <memLimit>900</memLimit>
        <cpuReserved>500</cpuReserved>
        <memReserved>500</memReserved>
        <vdisks>
          <VDisk>
            <capacity>250000</capacity>
            <profile>STORAGE_PROFILE_SILVER</profile>
          </VDisk>
        </vdisks>
      </vm>
      <action>deploy</action>
    </Event>
    <Event timestamp="20">
      <cluster ref="clusterSlow"/>
      <host name="saver" template="fast_host"/>
      <action>attach</action>
    </Event>
    <Event timestamp="30">
      <datastore ref="datastoreLarge"/>
      <host ref="saver"/>
      <action>connect</action>
    </Event>
    <Event timestamp="40">
      <vm name="vmList2" number="6">
        <cpu>1000</cpu>
        <mem>1000</mem>
        <cpuLimit>900</cpuLimit>
        <memLimit>900</memLimit>
        <cpuReserved>500</cpuReserved>
        <memReserved>500</memReserved>
        <vdisks>
          <VDisk>
            <capacity>200000</capacity>
            <profile>STORAGE_PROFILE_SILVER</profile>
          </VDisk>
        </vdisks>
      </vm>
      <action>deploy</action>
    </Event>
  </Events>
</SCENARIOS>
```

FIG. 3c

SYSTEM AND METHOD FOR SIMULATING VIRTUAL MACHINE (VM) PLACEMENT IN VIRTUAL DATACENTERS

BACKGROUND

A virtual machine (VM) is a software-based emulation of a physical computer. Although virtual machines are software-based emulations, the emulations still utilize physical resources in physical machines referred to as host computers.

A virtual server, such as VMware® vCenter Server™, can provide a centralized way of managing virtual infrastructure resources like compute, storage, networks, etc. Infrastructure resources can also be aggregated and grouped using abstractions such as a cluster. Datastores can similarly be grouped into datastore clusters.

A scheduler, such as VMware vSphere® Distributed Resource Scheduler™ (vSphere DRS), can be employed and configured to perform various management event functions in order to efficiently allocate resources within hosts to VMs in a cluster. A virtual server can provide a way of performing intelligent and automatic resource management within clusters via the scheduler. For example, the scheduler can perform automatic initial placement of a virtual machine within a compute cluster. Similarly, a storage scheduler, such as VMware vSphere® Storage DRS™, can similarly perform automatic selection of datastores for placing virtual machine disks (VMDKs) of the VMs. However, with the increasing scale of virtualized datacenters, current abstractions such as clusters are not sufficient.

A virtual datacenter (VDC) is an abstraction that can provide seamless aggregation of infrastructure resources across clusters. Compute resources are aggregated across clusters into a single pool of resources called a compute fabric. Similarly, storage and network resources are pooled and managed via a storage fabric and a network fabric, respectively. Delegation of these resources to VMs and virtual applications (vApps) is intelligently handled by a placement engine (PE) which performs resource- and policy-aware placement in the VDC. The VDC is a key building block towards a software-defined datacenter vision in which infrastructure is abstracted from underlying hardware and aggregated into pools of resources.

The PE tries to achieve multiple objectives while making a placement decision. For example, the PE considers balanced utilization of multiple resources across clusters, avoids fragmentation of resources, and handles policy constraints like storage profiles, affinity/anti-affinity rules, etc. The scale and complexity of the underlying infrastructure makes it difficult to design an effective, yet highly scalable, PE. Prototyping, iterating, and testing a PE that can handle thousands of VMs and hosts is difficult to perform with real physical hardware.

SUMMARY

In an embodiment, a placement simulator is used for testing a placement engine in a virtual machine environment. The placement simulator includes a simulation controller, an event manager, and an inventory manager. The simulation controller receives input data for a simulated datacenter. The event manager invokes event handlers for a sequence of events from the input data. The inventory manager stores states of inventory objects to simulate deployment of virtual infrastructure resources by the placement engine based on the sequence of the events. Other embodiments of the placement simulator are also described.

In another embodiment, a method is implemented for testing a placement engine in a virtual machine environment. An embodiment of the method includes receiving input data for a simulated datacenter at a simulation controller of a placement simulator. The placement simulator is coupled to the placement engine. The method also includes performing a sequence of events from the input data. The method also includes coordinating with the placement engine to simulate deployment of virtual infrastructure resources based on the sequence of the events. Other embodiments of the method are also described.

In another embodiment, a non-transitory computer-readable storage medium stores program instructions which, when executed by one or more processors causes the one or more processors implements operations related to testing a placement engine for virtual machines and virtual infrastructure resources. In an embodiment, the operations include implementing a placement simulator to interface with a placement engine in a virtual machine environment. The operations also include simulating deployment of virtual infrastructure resources by the placement engine. Embodiments with further operations are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 3a depicts one embodiment of the template file of FIG. 2 with template data for use as input data with the simulation controller of the placement simulator.

FIG. 3b depicts one embodiment of the inventory file of FIG. 2 with inventory data for use as input data with the simulation controller of the placement simulator.

FIG. 3c depicts one embodiment of the scenario file of FIG. 2 with scenario data for use as input data with the simulation controller of the placement simulator.

Throughout the description, similar reference numbers may be used to identify similar elements.

DETAILED DESCRIPTION

Figure 1:
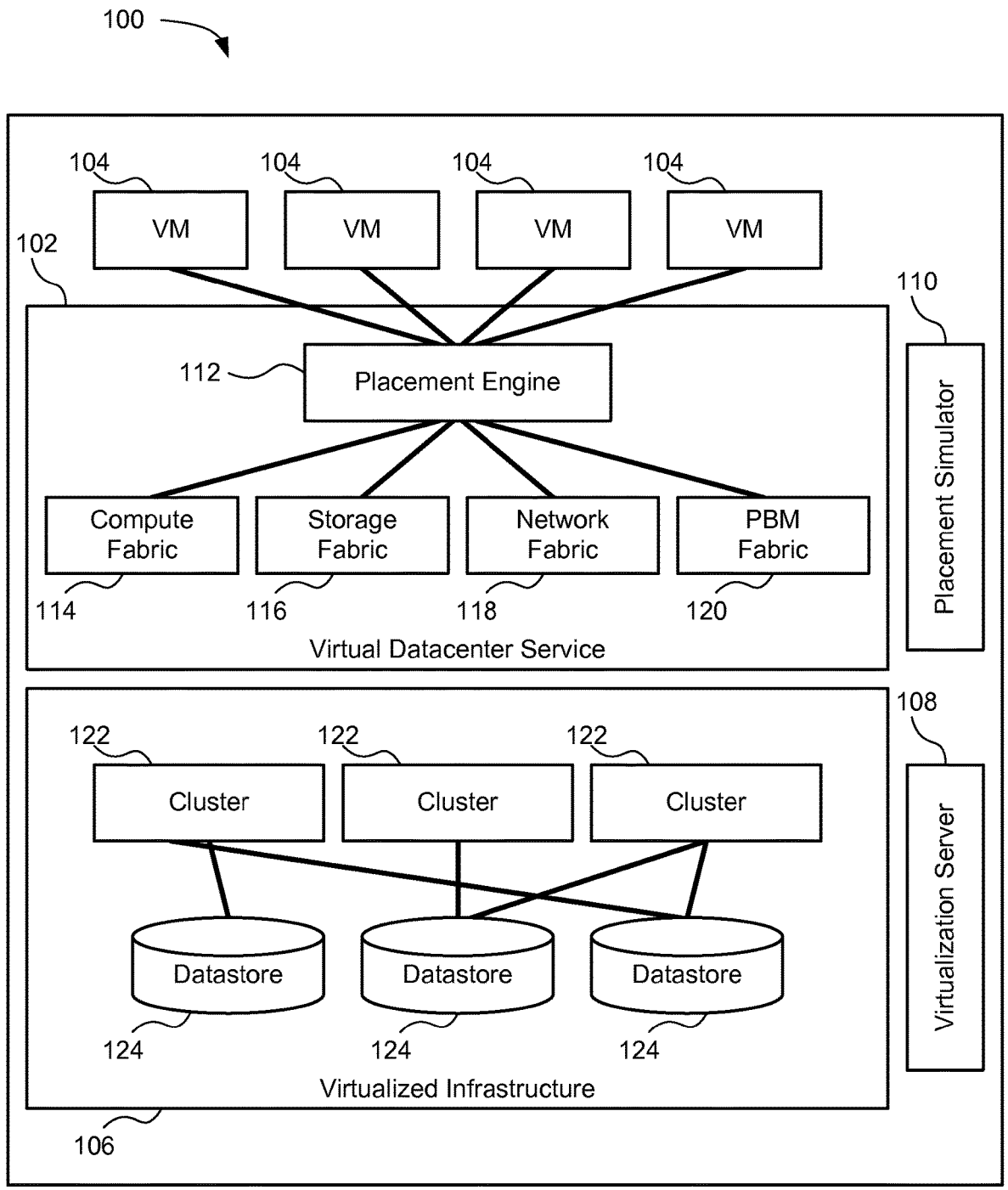
FIG. 1 is a schematic block diagram of one embodiment of a cloud infrastructure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the embodiments implement an architecture of a highly extensible event driven placement simulator (PS) that can simulate an entire VDC and provide a wide range of infrastructure abstractions like hosts, datastores, clusters, etc. Embodiments of the placement simulator implement a tool for prototyping and testing a placement engine.

FIG. 1 is a schematic block diagram of one embodiment of a cloud infrastructure 100. The illustrated cloud infrastructure 100 includes a virtual datacenter service 102, several virtual machines 104, a virtualized infrastructure 106, a virtualization server 108, and a placement simulator 110. Further, the virtual datacenter service 102 includes a placement engine 112, and several fabrics, including a compute fabric 114, a storage fabric 116, a network fabric 118, and a policy based management (PBM) fabric 120. The virtualized infrastructure 106 includes several clusters 122 and several datastores 124. Although the cloud infrastructure 100 is shown and described with certain components and functionality, other embodiments of the cloud infrastructure 100 may include fewer or more components to implement less or more functionality.

The depicted cloud infrastructure 100 includes a typical cloud infrastructure with a set of clusters 122 and datastores 124 managed by a virtualization server 108 such as the VMware® vCenter™. For reference, the clusters 122 and the datastores 124 are referred to as resources. The resources in this model are aggregated by the fabrics 114-120. Specifically, the resources are aggregated by each of the corresponding compute fabric 114, the storage fabric 116, and the network fabric 118. The placement engine 112 runs on top of these fabrics 114-120 and places the virtual machines 104 with the help of underlying fabrics 114-120.

In one embodiment, the primary goal of the placement engine 112 is to find a suitable cluster 122 and datastore 124 for a newly created virtual machine 104 with the help of the various fabrics (compute, storage and network). The host selection for a virtual machine 104 within the cluster 122 is handled by the instance of that cluster 122. In one embodiment, the placement engine expects an application program interface (API) from each of the fabrics 114-120. The high-level API that the placement engine expects from each fabric may be:

HubFinder(List <candidateCluster>,
List <placementSubject>,
placementSolution)

where candidateCluster represents a vSphere DRS enabled cluster, placementSubject specifies a single virtual machine and the associated requirements, and placementSolution represents the current solution. Although specific terminology is referenced herein with respect to this API, other embodiments may utilize other terminology and/or equivalent or similar functionality. Each fabric 114-120 implements HubFinder whose task is to prune the list of clusters 122, by filtering out ineligible clusters 122 based on the virtual machine requirements, and return the valid list annotated with some fabric specific statistics. In one embodiment, the fabrics 114-120 return a set of tuples <Clusteri; <utilization+>;Opaquedata>; each tuple identifies an eligible cluster along with associated utilization metrics and some opaque data. Other embodiments may include different and/or additional fields.

As an example, a virtual machine 104 requiring a gold storage profile cannot be placed in a cluster 122 that is connected only to datastores with silver or bronze storage profiles. Thus, a request for a gold storage profile prompts the storage fabric 116 to prune all silver and bronze (or other non-gold) clusters 122 from the list of eligible clusters 122. For each remaining eligible cluster 122, the storage fabric 116 will return utilization metrics for the best datastore 124 connected to that cluster 122. The storage fabric 116 also may return the universally unique identifier (UUID) of the datastore 124 as part of the opaque data. Similarly, the compute fabric 114 can remove a candidate cluster 122 from the list of eligible clusters 122 if none of the hosts in the cluster 122 has the specific capabilities required by the virtual machine 104.

After going through each of the fabrics 114-120 in turn, the placement engine 112 receives a list of surviving clusters 122 that meet all the resource (compute, storage, network) constraints of the virtual machine 104, along with utilization metrics for each resource. The placement engine 112 may rank these clusters 122 based on CPU, memory, storage, and network utilization metrics in order to find a compatible cluster 122, or the best cluster 122, for the placement. In some instances, this process may result in the selection of the best cluster 122 and datastore 124 pair, since the best datastore 124 utilization is provided by the storage fabric 116 as part of returning the list of viable clusters 122 to the placement engine 112. The placement engine 112 may implement any type of ranker or ranking algorithm.

In general, the placement simulator 110 is coupled to the placement engine 112 to facilitate testing, prototyping, or other simulations with the placement engine 112. In some embodiments, the placement simulator 110 may be used with the placement engine 112 prior to deployment of the placement engine 112 within a functional cloud infrastructure.

Figure 2:
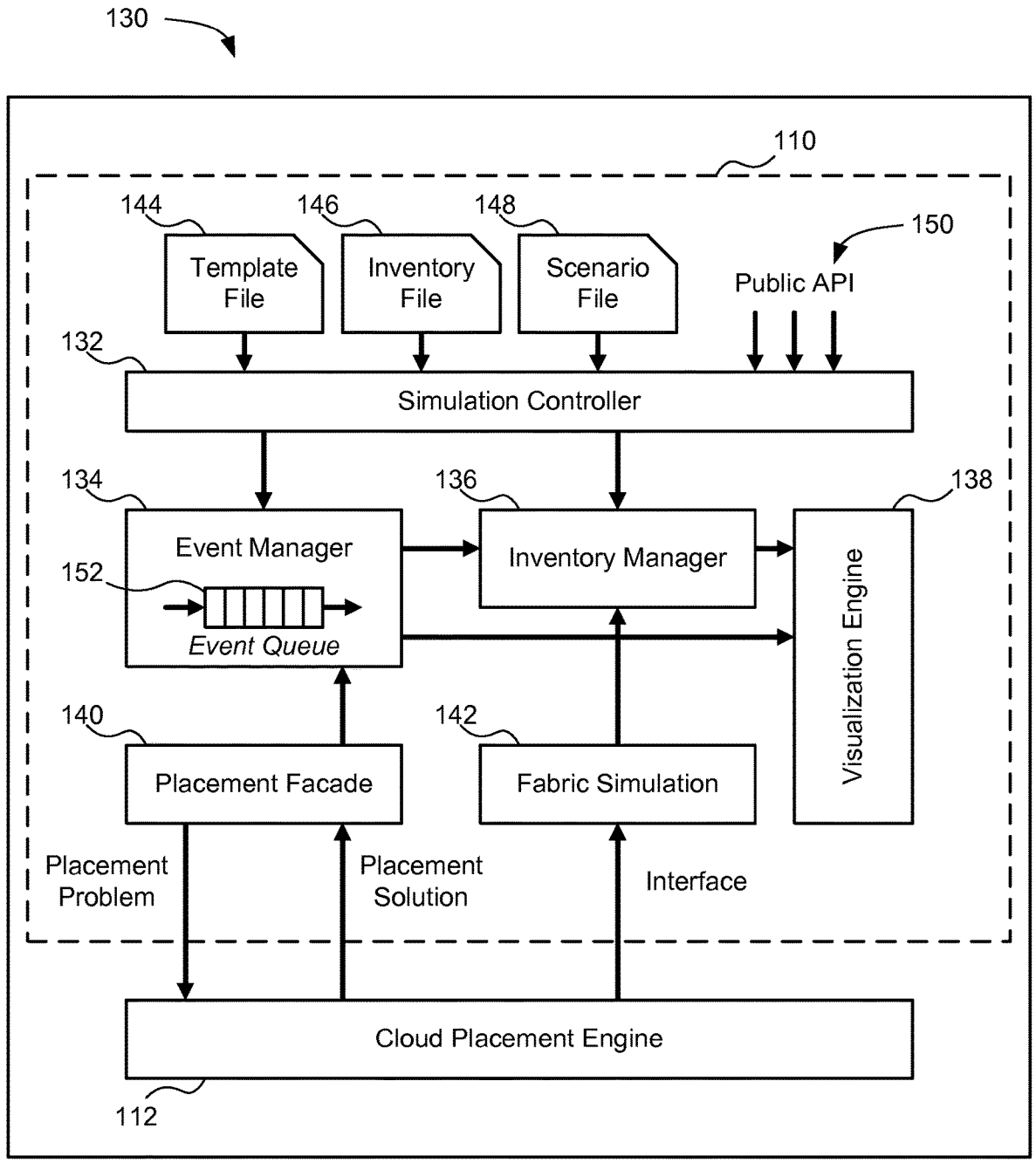
FIG. 2 is a schematic block diagram of an embodiment of a virtual testing system with a more detailed embodiment of the placement simulator of FIG. 1.

FIG. 2 is a schematic block diagram of an embodiment of a virtual testing system 130 with a more detailed embodiment of the placement simulator 110 of FIG. 1. The illustrated virtual testing system 130 includes the placement simulator 110 and the cloud placement engine 112. The depicted placement simulator 110 includes a simulation controller 132, an event manager 134, an inventory manager 136, a visualization engine 138, a placement façade 140, and a fabric simulation 142. The simulation controller 132 may receive any of a variety of input data such as a template file 144, an inventory file 146, a scenario file 148, or data through a public API 150. Although the virtual testing system 130 is shown and described with certain components and functionality, other embodiments of the virtual testing system 130 may include fewer or more components to implement less or more functionality.

The placement engine 112 is intended to be highly scalable. This makes testing the placement engine 112 relatively difficult due to the scale and complexity of the physical infrastructure. The costs and time required for setting up a real infrastructure for testing the placement engine can be relatively high or even impractical in many cases.

Although several embodiments of the placement simulator 110 may be implemented, some of the embodiments may be directed at one or more of the following functional issues:

1. Providing a rapid prototyping platform for iterating on and evaluating the effectiveness of the placement engine 112.
2. Implementing the ability to simulate complex inventory setups with multiple clusters, hosts, datastores, etc., and the ability to specify connections between them.
3. Implementing the ability to run multiple test scenarios without recompiling modules for the placement engine 112 or the placement simulator 110.
4. Providing a powerful and interactive user interface to visualize the state of the inventory objects and related statistics.
5. Providing a rich set of APIs to build an automated testing suite for the placement engine 112.

The high level design of the placement simulator 110 shown in FIG. 2 includes various components and their functionality interactions. These components operate based on input data that is provided to the placement simulator 110. In one embodiment, the input format for the placement simulator 110 can support hierarchies, enumerations, and references in order to represent inventory design, virtual machine requirements, and so forth. In some embodiments, a custom XML based format allows the virtual testing system 130 to build a simulated datacenter, including multiple clusters, hosts, datastores, and the connectivity between them.

In the illustrated embodiment, the input data is supplied by three XML files. Although file structures are references, other embodiments may use other forms of data structures. The contents of the input files are read by an XStream based reader, or another suitable reader, and loaded in memory (not shown). Examples of the template file 144, the inventory file 146, the scenario file 148, and their respective data content are shown in FIGS. 3a-c and discussed in more detail below.

In one embodiment, the simulation controller 132 receives the input data and performs the initializations and startup routines of the placement simulator 110. Specifically, the simulation controller 132 initializes the inventory manager 136 with the template file 144 and the inventory file 146. The simulation controller 132 also initializes the event manager 134 with the scenario file 148. The simulation controller 132 also may provide an entry point for a set of public APIs 150 which can be used to build programmatic inventory creation and event injection instead of a file based input.

In one embodiment, the event manager 134 parses the events from the scenario file 148 in memory and feeds the parsed events into a priority queue 152. The events may be sorted and stored in chronological order within the event queue 152. The event manager serially steps through the event queue 152 by invoking appropriate event handlers for each event. Event execution might involve interaction with the placement engine 112 via the placement facade 140, which acts as an interface between the placement simulator 110 and the placement engine 112. Alternatively, the event execution might involve interaction with the inventory manager 136 to update the state(s) of the inventory. In other words, when the event manager 134 executes an event, the event manager 134 may send instructions to the inventory manager 136 to update a state of one or more inventory objects.

As one example, during a typical DeployVMs event, the event manager 134 passes the virtual machine requirements (e.g., as part of a placement problem) to the placement facade 140 and receives a cluster-datastore pair in return (e.g., as part of a placement solution). The event manager 134 then commands the inventory manager 136 to deploy the virtual machine 104 into the indicated cluster 122 and datastore 124, at which time the inventory manager 136 updates a state (or other indicator) to indicate the instructed deployment. This allows the event manager 134 to simulate execution of an event that requires deployment, and the inventory manager 136 tracks the simulated deployment. Once the inventory state has been updated, the event manager 134 may invoke the visualization engine 138 to update a graphical representation (not shown) of the inventory and fetch the latest available stats from the inventory manager 136.

In one embodiment, the primary job of the inventory manager 136 is to populate a simulated virtual datacenter (VDC) in-memory during startup by reading the template file 144 and the inventory file 146. The inventory manager 136 acts as a source of state information for the state of the inventory objects and the associations between them. In some embodiments, the inventory manager 136 may utilize one or more of the following inventory abstractions.

Within the inventory manager 136, a host may represent a VMware® ESXi™ host managed by a cluster 122 in the VDC. The host object maintains the associations with the resident virtual machines 104 and connected datastore objects 124. A typical host object can have the following properties: hostId, vmList, connectedDatastoresList, parentCluster, totalCPUCapacity, reservedCPUCapacity, totalMemoryCapacity, reservedMemoryCapacity, numCPUCores, hardwareVersion, etc. In other embodiments, host objects may have other typical or related properties.

Within the inventory manager 136, a cluster represents a typical cluster 122 that provides an aggregation of hosts. A typical cluster object can have the following properties: clusterId, parentVDC, hostList, connectedDatastoreList, etc. In other embodiments, cluster objects may have other typical or related properties. A cluster object also may have several capacity related properties that are aggregated across hosts such as aggregateCPUCapacity, aggregateMemoryCapacity. Additionally, the cluster object also may contain a naive and over-simplified implementation of initial placement to pick a compatible host for a given virtual machine 104.

Within the inventory manager 136, a datastore represents a typical datastore 124 managed by the virtual server 108. The datastore object maintains the associations with the resident virtual machine disks (VMDKs) and provides properties such as totalCapacity, utilizedCapacity, storageProfile, etc. In other embodiments, datastore objects may have other typical or related properties.

Within the inventory manager 136, a VM object provides values for configured capacity, utilized capacity, reserved, limit and shares for both CPU and Memory. The VM object also may maintain the associations with the connected VMDK objects. The VMDK objects provide properties such as configuredCapacity, usedCapacity, profileType, parentVM, parentDatastore, etc. In other embodiments, the VM and VMDK objects may have other typical or related properties.

Within the inventory manager 136, a VMRuleGroup object may be used to represent VM-to-VM affinity and anti-affinity rules that need to be respected by the placement engine 112. In this way, the inventory manager 136 essentially maintains a list of virtual machines 104 that are a part of the rule, as well as the polarity and scope of the rule. The inventory manager 136 may support different types of polarities such as hard anti-affine, hard affine, soft anti-affine, and soft affine. Different types of scopes such as host, cluster and geography may be supported as well.

In one embodiment, the placement facade 140 acts as the bridge or interface between the placement simulator 110 and the placement engine 112. The placement engine 112 exposes a PlacementSolver interface which provides the following API:

PlacementSolution solve (PlacementProblem)

The PlacementProblem contains the list of virtual machines 104 to be placed, their requirements, candidate clusters and anti-affinity/affinity rules (if any). The solve API returns back a PlacementSolution (if it exists) which contains the association of each virtual machine 104 to its assigned cluster 122. Essentially, the job of the placement facade 140 is to prepare the placement problem, invoke the solve API, extract the placement information from the placement solution, and pass the placement information back to the event manager.

In one embodiment, the fabric simulation 142 interfaces with the inventory manager 136 in order to fetch stats about inventory objects such as clusters 122 and datastores 124. This allows the existing fabric finders to work with the simulated infrastructure that is maintained at the inventory manager 136. Accordingly, the placement engine can rely on simulated fabrics to make a placement decision.

Visual inspection of the decisions made by the placement engine 112, and their effect on the state of inventory, can be very helpful for debugging and validating placement algorithms. In one embodiment, the visualization engine 138 converts the state(s) of the inventory into a format that is easy to visualize. As most of the inventory objects in the VDC have associations with each other, one visualization uses the graph description language named DOT to represent the state of the inventory. Other embodiments may use other types of visualization graphing or depiction languages. After the execution of every event, the visualization engine 138 updates the DOT representation to provide the ability to step through the different events in a scenario.

FIG. 3a depicts one embodiment of the template file 144 of FIG. 2 with template data for use as input data with the simulation controller 132 of the placement simulator 110. The illustrated template file 144 contains reference templates or profiles for building inventory objects such as a host, a datastore, or a virtual machine. In some embodiment, there are multiple templates specified for these inventory types. For example, there can be host templates such as LargeHost, MediumHost, SmallHost based upon their CPU and memory capacities. Similarly, there can be datastore templates representing datastores with different tiers of storage such as GoldDatastore, SilverDatastore, etc. The objects created in the template files can be referenced via their unique names in the inventory files. This essentially allows the inventory manager 136 to create multiples of these inventory objects without repeating their configurations. It also enables the inventory manager 136 to create large and complex inventories quickly.

FIG. 3b depicts one embodiment of the inventory file 146 of FIG. 2 with inventory data for use as input data with the simulation controller 132 of the placement simulator 110. The illustrated inventory file 146 facilitates creating inventory objects such as clusters, hosts, datastores, etc. The inventory file 146 also helps establish relationships and connectivity between the various inventory objects. Inventory objects may be created by referencing to a template object specified in the template file 144. Alternatively, a custom object can be specified directly in the inventory file 146.

FIG. 3c depicts one embodiment of the scenario file 148 of FIG. 2 with scenario data for use as input data with the simulation controller 132 of the placement simulator 110. The illustrated scenario file 148 specifies one or more scenarios. A scenario is a set of events for execution in a chronological or sequential order. The placement simulator 110 supports various event handlers such as DeployVMs, ReleaseVMs, AddClustersToVDC, RemoveClustersFromVDC, ConnectClustersToDatastore, DisconnectDatastore, EnterClusterMaintenanceMode, EnterDatastoreMaintenanceMode, etc.

In one embodiment, every event is marked with a timestamp (or other sequential identifier) and an associated action. Events may also include one or more inventory object types such as virtual machines, clusters, datastores, etc. As illustrated in the sample scenario file, several requirements such as CPU/memory reservation and limits, storage capacity, storage profile, etc. can be specified while creating virtual machines. Additionally, constraints such as VM-to-VM affinity and anti-affinity rules can also be described.

In one embodiment, the placement simulator 110 and the placement engine 112 are both implemented in Java using the Spring framework. In this implementation, both components are a part of the same compilation unit and can be consumed as a single .jar file. For executing the simulation, a TestNG client can be used to invoke the simulation controller 132 with the input files. Other embodiments may be implemented using other code, frameworks, numbers of files, and so forth.

In some embodiments, the placement simulator is used while prototyping and testing the placement engine 112 and placement engine algorithms. Although only a small subset of the large number of possible scenarios are described herein, the embodiments herein are not limited to particular scenarios or input data.

Figure 4A:
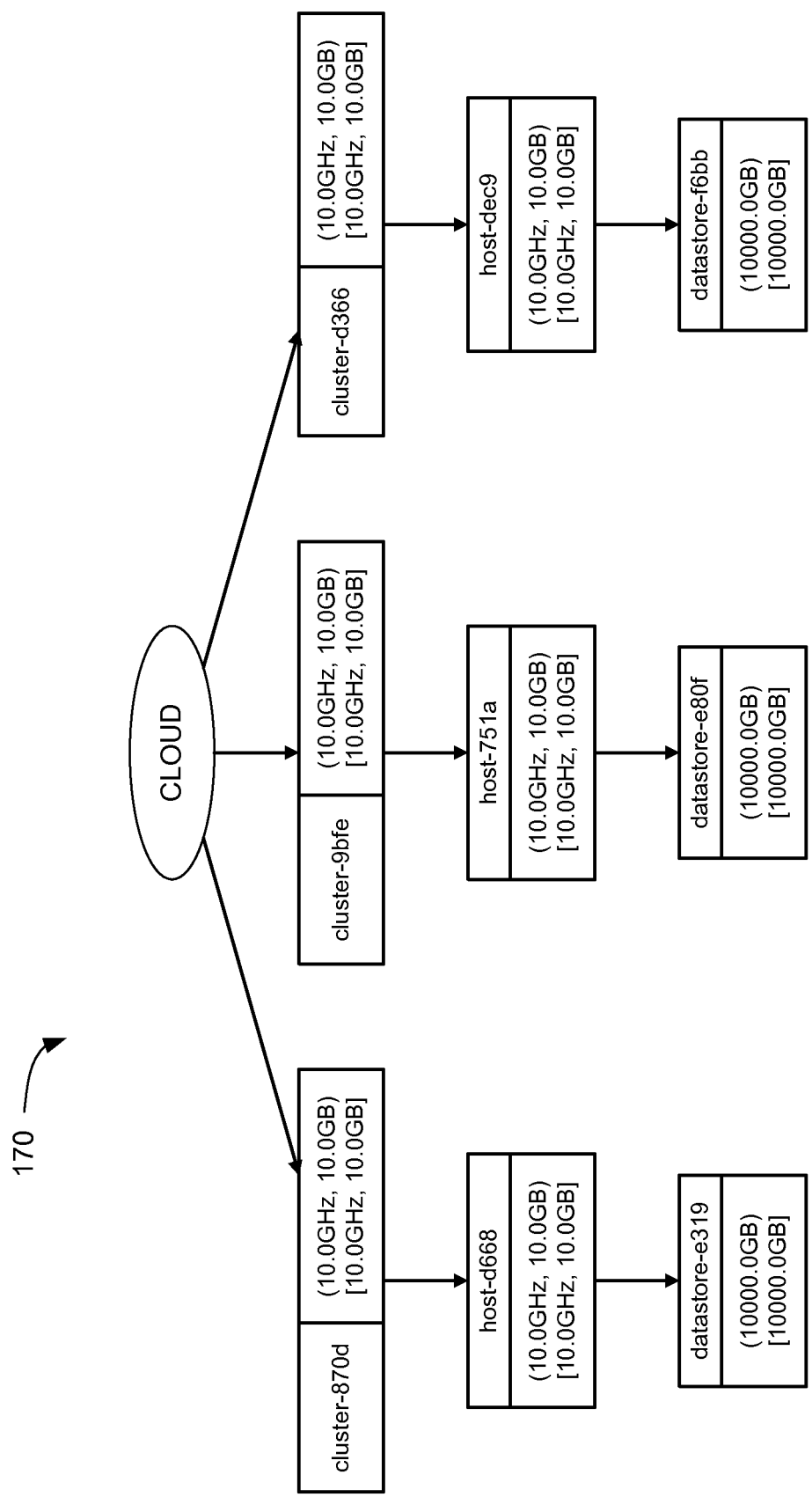
FIGS. 4a and 4b depict an embodiment of before and after states of inventory objects in a simulated test scenario using host level anti-affinity between virtual machines.
Figure 4B:
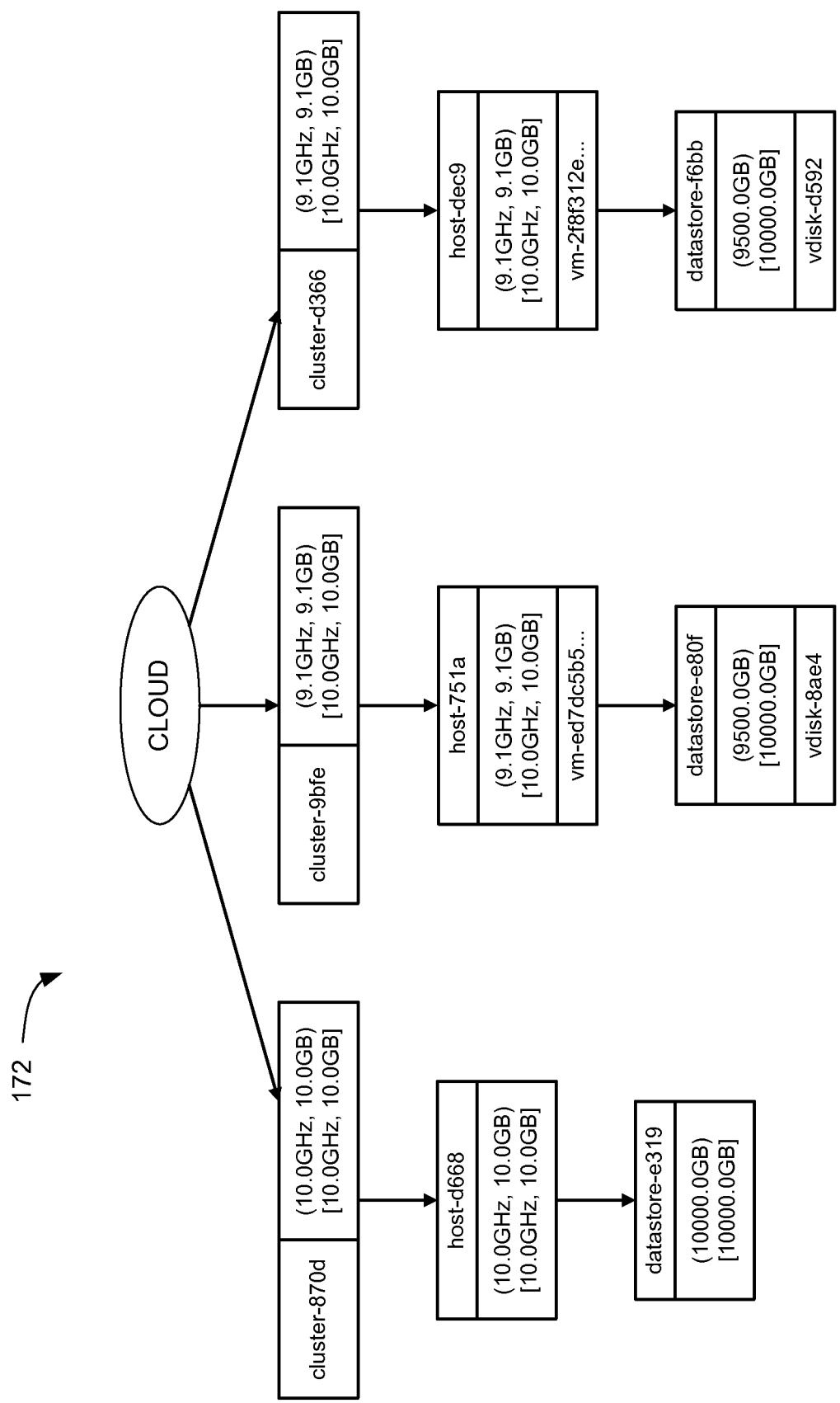

FIGS. 4a and 4b depict an embodiment of before and after states 170 and 172 of inventory objects in a simulated test scenario using host level anti-affinity between virtual machines. In the VDC, there are several scenarios when a set of VMs need to be isolated from each other. The isolation domains could be hosts, clusters, geographies, etc. Embodiments of the placement engine 112 can handle host level anti-affinity between VMs.

Specifically, FIG. 4a shows the visual representation of a simulated VDC by the placement simulator 110. This visual representation may be generated by the visualization engine 138. As shown, there are three clusters with one host each. Each of these hosts has a total CPU capacity of 10.0 GHz and memory capacity of 10 GB. Each of these hosts is connected to different but identical datastores with 1000 GB of storage. FIG. 4b illustrates the creation of two identical virtual machines with CPU and memory limits of 0.9 Ghz and 0.9 GB. These VMs have a host-level anti-affinity defined between them. The first virtual machine is placed on one cluster, while the other virtual machine is placed on a different cluster.

Figure 5A:
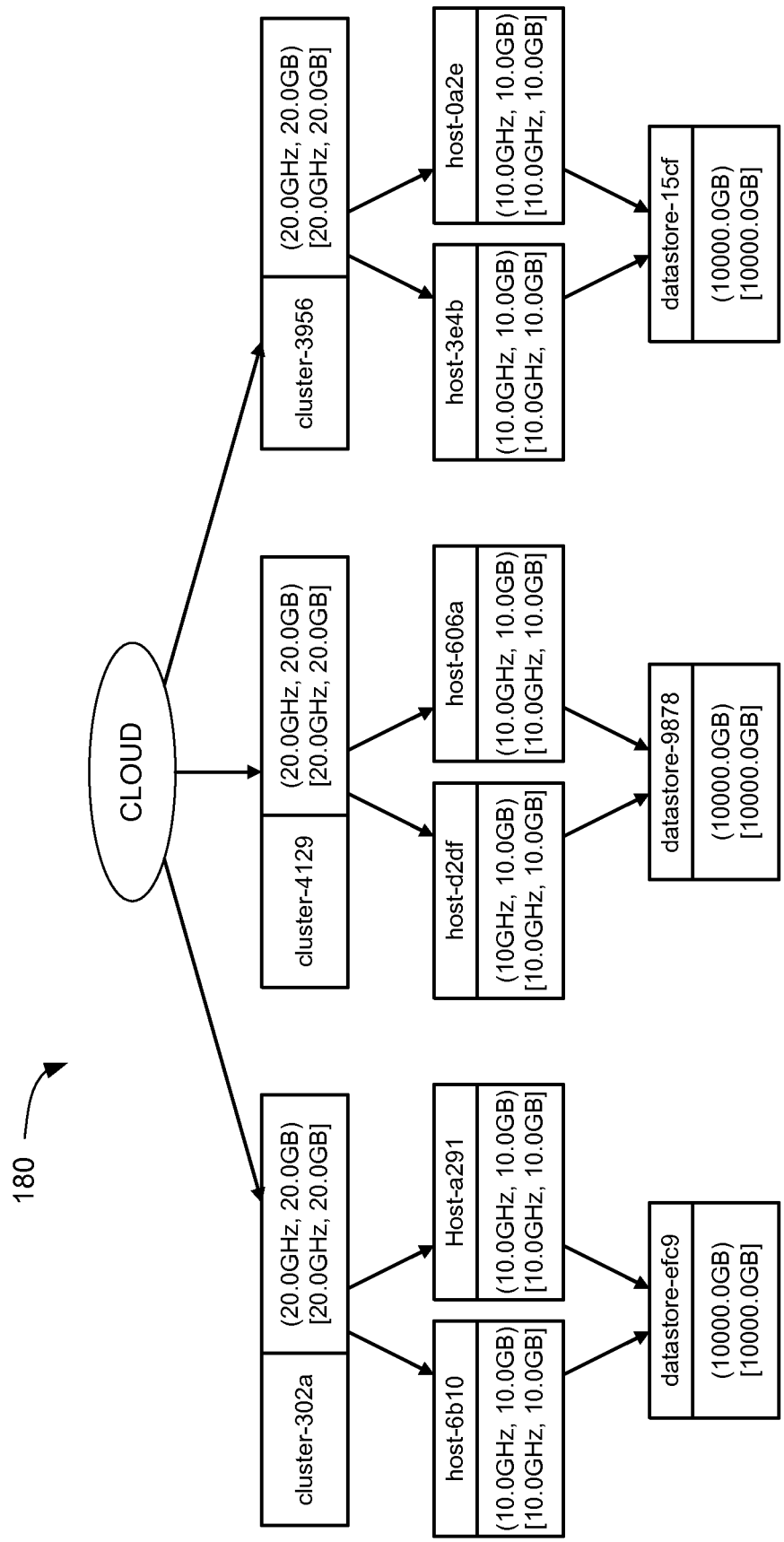
FIGS. 5a and 5b depict an embodiment of before and after states of inventory objects in another simulated test scenario using cluster level affinity between virtual machines.
Figure 5B:
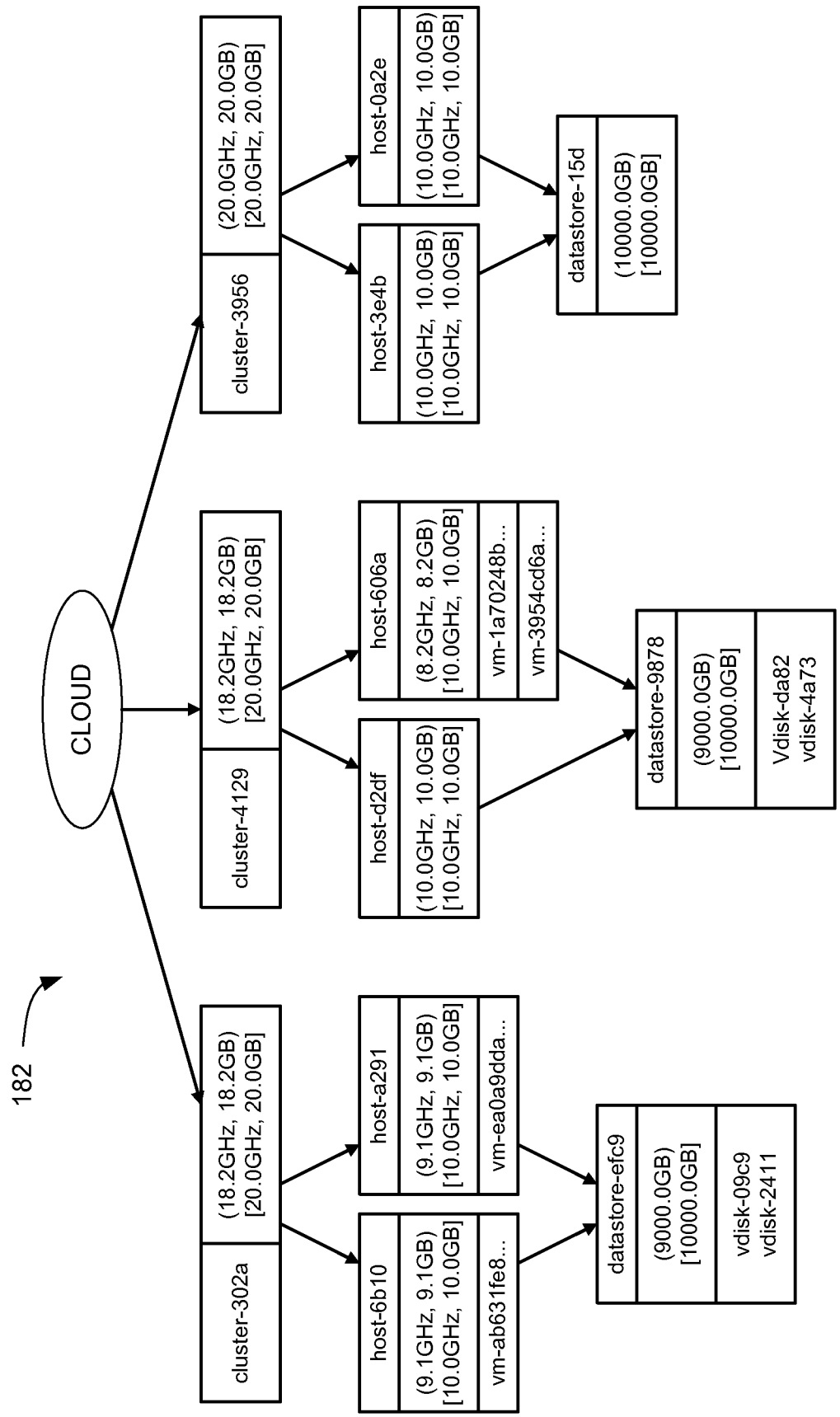

FIGS. 5a and 5b depict an embodiment of before and after states 180 and 182 of inventory objects in another simulated test scenario using cluster level affinity between virtual machines. In this scenario, the placement of a set of virtual machines is confined to a particular domain like a host or a cluster. As shown in FIG. 5a, a simulated inventory is created with three clusters with two hosts each. Each of these clusters is fully connected to different but identical datastores. FIG. 5b shows the creation of two identical VMs with cluster level affinity between them. The two virtual machines are confined to the same cluster by the placement engine 112. Similarly, another set of identical virtual machines is created with cluster level affinity which are similarly confined to the same cluster.

Figure 6A:
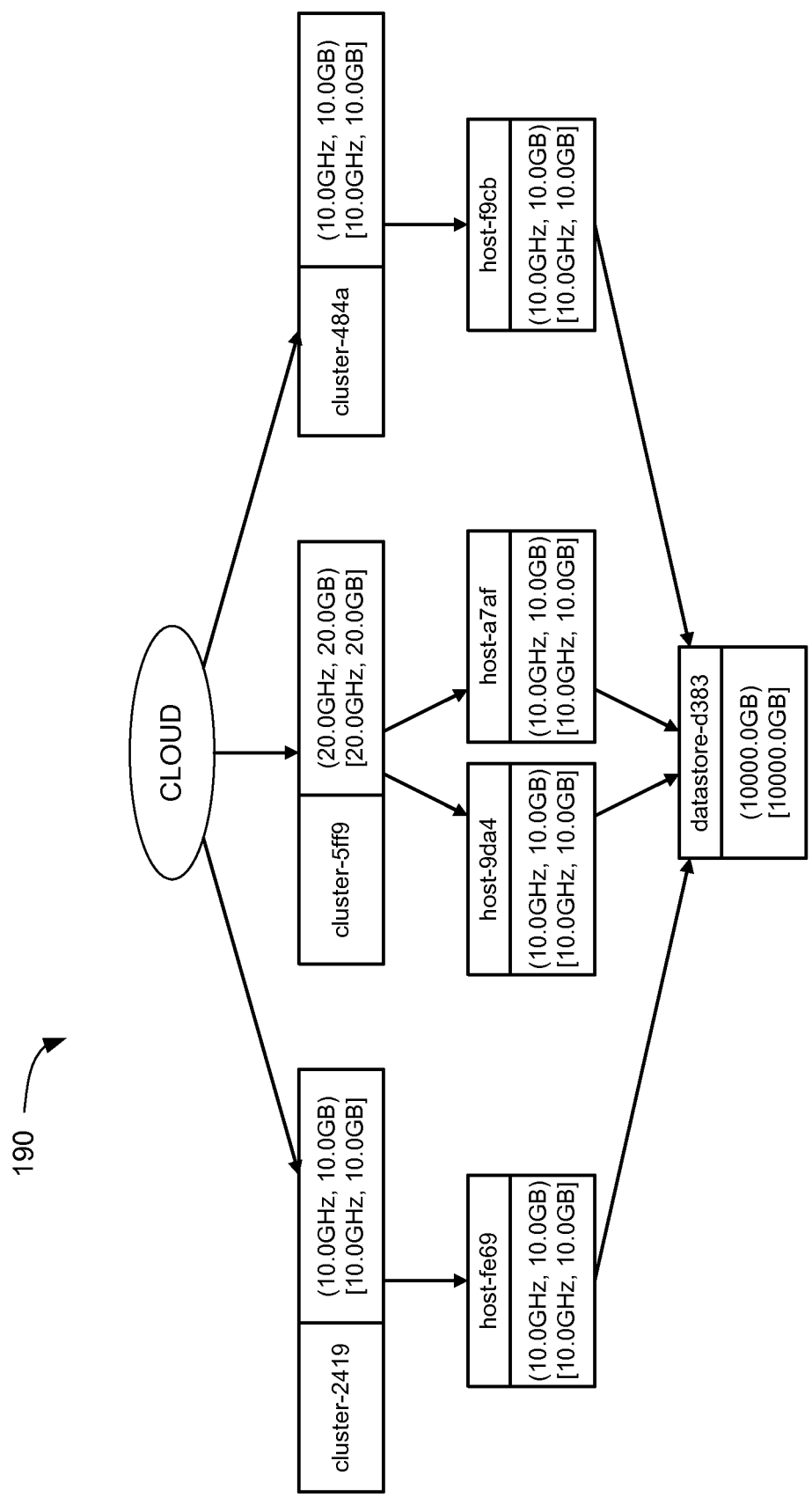
FIGS. 6a and 6b depict an embodiment of before and after states of inventory objects in another simulated test scenario using both affinity and anti-affinity constraints.
Figure 6B:
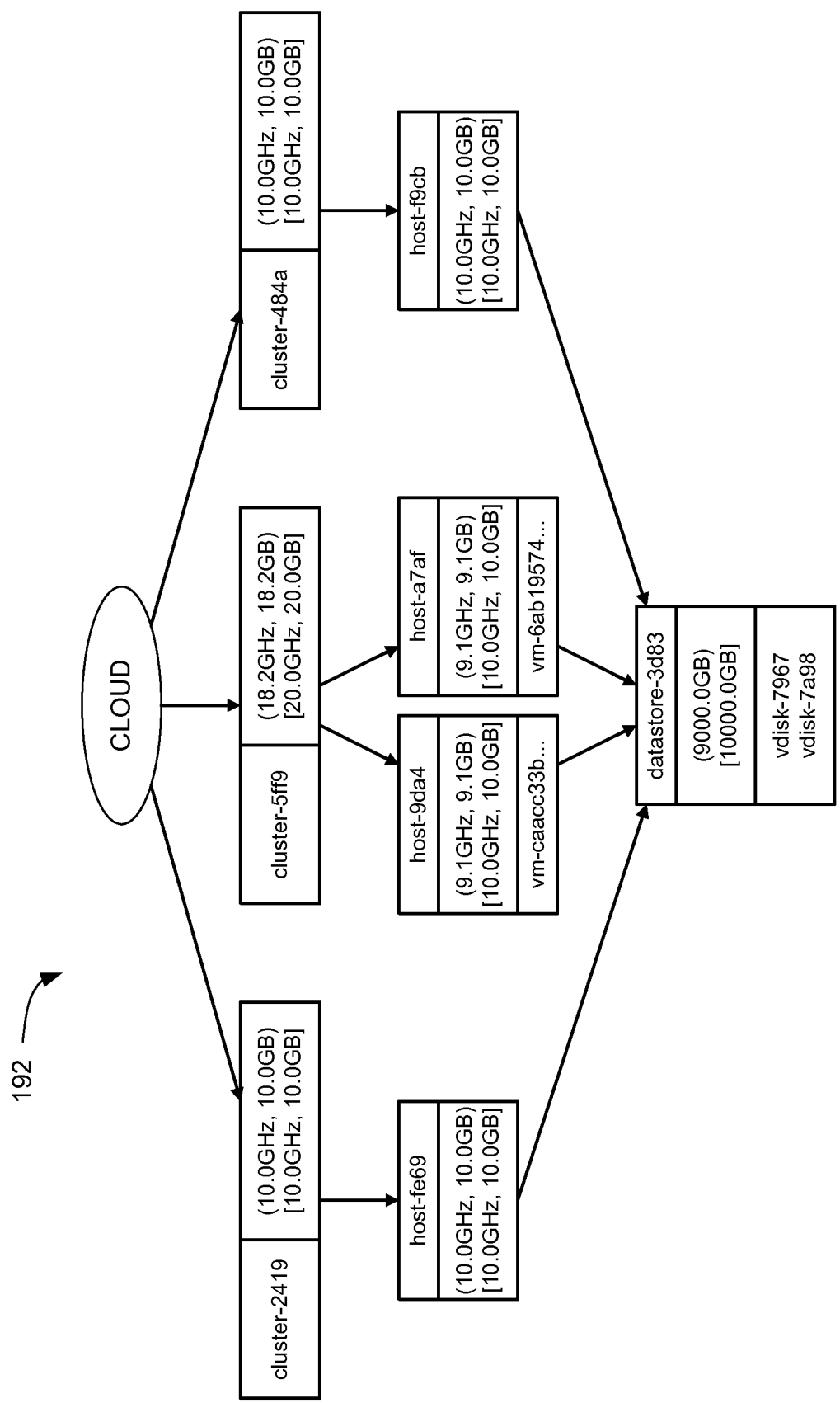

FIGS. 6a and 6b depict an embodiment of before and after states 190 and 192 of inventory objects in another simulated test scenario using both affinity and anti-affinity constraints. This demonstrates a scenario where multiple constraints are specified at the same time. As shown in FIG. 6a, the inventory includes three clusters. One cluster has two hosts, while the other two clusters have a single host. All hosts are identical and are connected to the same datastore. As illustrated in FIG. 6b, two identical virtual machines are confined to the same cluster but isolated on different hosts. That means they have a cluster level affinity and a host level anti-affinity at the same time. In FIG. 6b, one of the clusters has two hosts available to satisfy the host level anti-affinity constraint.

Figure 7:
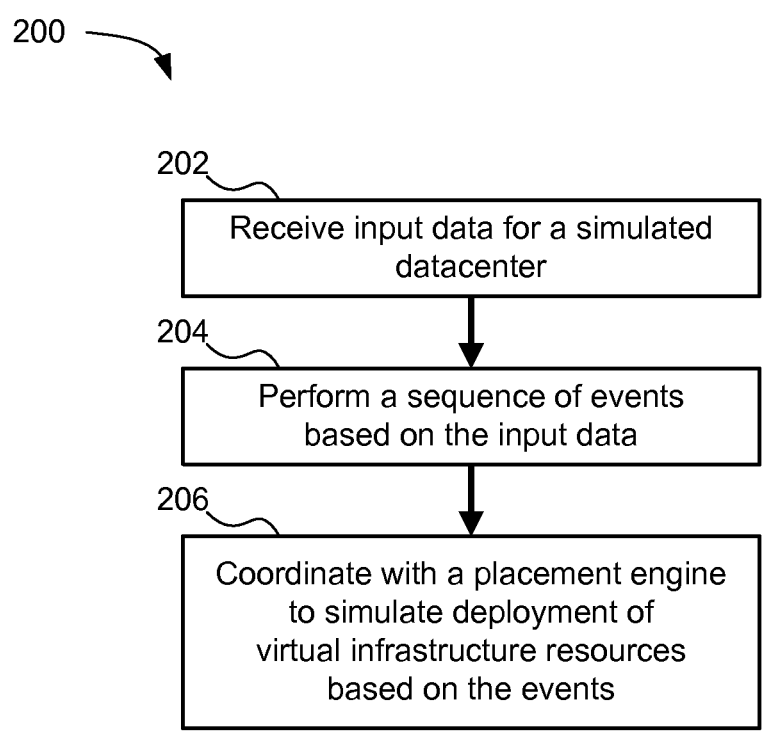
FIG. 7 is a process flow diagram of one embodiment of a method for testing a placement engine in a virtual machine environment.

FIG. 7 is a process flow diagram of one embodiment of a method 200 for testing a placement engine 110 in a virtual machine environment. Although the method 200 is described in relation to the placement engine 110 and the placement simulator 112 of FIGS. 1 and 2, other embodiments of the testing method 200 may be implemented with other placement engines and/or placement simulators.

The depicted method 200 begins as the placement simulator 110 receives 202 input data for a simulated datacenter. As explained above, the input data may include template data, inventory data, and scenario data.

The placement simulator 110 uses the input data to perform 204 a sequence of events that are specified, for example, in the scenario data. While executing these events, the placement simulator 110 coordinates 206 with the placement engine 112, as needed, to simulate deployment of the virtual infrastructure resources based on the various events. The depicted method 200 then ends.

In a further aspect, the method 200 also may include receiving template data which includes a reference profile for building an inventory object. The method 200 also may include receiving inventory data which specifies instances of inventory objects and virtual resource connectivity among the inventory objects. The method 200 also may include populating a virtual datacenter (VDC) using the inventory data, and maintaining states of the inventory objects over the sequence of the events. The method 200 also may include generating a visualization of the states of the inventory objects over the sequence of the events to facilitate inspection of the states of the inventory objects over the sequence of the events.

In a further aspect, the method 200 also may include receiving scenario data which includes a set of the events for simulated execution. As described above, at least some of the events invoke coordination with the placement engine 112 to simulate the deployment of the virtual infrastructure resources based on the events. The method 200 also may include performing an initialization routine to initialize an event manager with the scenario data, parsing the sequence of events from the scenario data, passing a virtual machine requirement from an event to the placement engine 112, receiving a deployment instruction to simulate the deployment of at least one virtual infrastructure resource based on the event.

In a further aspect, the method 200 also may include preparing a placement problem for the placement engine 112, invoking an API between the simulation controller 132 and the placement engine 112, receiving a placement solution corresponding to the placement problem, and extracting placement information from the placement solution.

Embodiments of the placement simulator 110 may be useful in the design and implementation of versions of the placement engine 112 in the VDC. Use of the placement simulator 112 may enable key concepts and features such as cluster ranking using multi-dimensional resource comparison, constraints handling, tag-based placement, placement at scale, and so forth.

Although the operations of the method(s) herein are shown and described in a particular order, the order of the operations of each method may be altered so that certain operations may be performed in an inverse order or so that certain operations may be performed, at least in part, concurrently with other operations. In an embodiment, the monitor phase and the enforcement phase can occur concurrently. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A placement simulator for testing a placement engine in a virtual machine environment, the placement simulator comprising:
   a simulation controller to receive inventory and scenario data for a simulated virtual datacenter, wherein the inventory data specifies instances of inventory objects and virtual resource connectivity among the inventory objects, wherein the scenario data comprises a sequence of events, and wherein the events include interactions between the inventory objects, at least one of the events is a deploy event being marked with a timestamp, a virtual machine deploy action and resource requirements for a virtual machine being deployed;
   an event manager coupled to the simulation controller, the event manager to parse the sequence of events in the scenario data and store the sequence of events in a priority event queue in chronological order, wherein the event manager invokes event handlers for the sequence of events from the scenario data stored in the priory event queue so that the sequence of events are executed in the chronological order, wherein the deploy event is executed to simulate the virtual machine deploy action of the virtual machine using the placement engine;
   an inventory manager coupled to the event manager, the inventory manager to populate the simulated virtual datacenter using the inventory data and simulate deployment of virtual infrastructure resources in the simulated virtual datacenter by the placement engine based on the sequence of the events of the scenario data.

2. The placement simulator of claim 1, wherein the simulation controller is further configured to receive and store template data, wherein the template data comprises a reference profile for building an inventory object.

3. The placement simulator of claim 1, wherein the inventory manager is further configured to:
   maintain states of the inventory objects over the sequence of the events.

4. The placement simulator of claim 3, further comprising a visualization engine coupled to the inventory manager, the visualization engine configured to generate a visualization of the states of the inventory objects over the sequence of the events to facilitate inspection of the states of the inventory objects over the sequence of the events.

5. The placement simulator of claim 1, wherein at least some of the events invoke the coordinating with the placement engine to simulate the deployment of the virtual infrastructure resources based on the events.

6. The placement simulator of claim 5, wherein the event manager is further configured to:
   perform an initialization routine to initialize the event manager with the scenario data;
   parse the sequence of events from the scenario data;
   pass a virtual machine requirement from an event to the placement engine; and
   receive a deployment instruction to simulate the deployment of at least one virtual infrastructure resource based on the event.

7. The placement simulator of claim 1, further comprising a placement interface coupled between the event manager and the placement engine, wherein the placement interface is configured to:
   prepare a placement problem for the placement engine;
   invoke an application program interface (API) between the event manager and the placement engine;
   receive a placement solution corresponding to the placement problem; and
   extract placement information from the placement solution.

8. A method for testing a placement engine in a virtual machine environment, the method comprising:
   receiving inventory and scenario data for a simulated virtual datacenter at a simulation controller of a placement simulator coupled to the placement engine, wherein the inventory data specifies instances of inventory objects and virtual resource connectivity among the inventory objects, wherein the scenario data comprises a sequence of events, and wherein the events include interactions between the inventory objects, at least one of the events is a deploy event being marked with a timestamp, a virtual machine deploy action and resource requirements for a virtual machine being deployed;
   parsing the sequence of events in the scenario data;
   storing the sequence of events in a priority event queue in chronological order;
   invoking event handlers for the sequence of events from the scenario data stored in the priory event queue so that the sequence of events are executed in the chronological order, wherein the deploy event is executed to simulate the virtual machine deploy action of the virtual machine using the placement engine; and
   coordinating with the placement engine to populate the simulated virtual datacenter using the inventory data and simulate deployment of virtual infrastructure resources in the simulated virtual datacenter based on the sequence of the events of the scenario data.

9. The method of claim 8, further comprises receiving template data, wherein the template data comprises a reference profile for building an inventory object.

10. The method of claim 9, further comprising:
    maintaining states of the inventory objects over the sequence of the events.

11. The method of claim 10, further comprising generating a visualization of the states of the inventory objects over the sequence of the events to facilitate inspection of the states of the inventory objects over the sequence of the events.

12. The method of claim 8, wherein at least some of the events invoke the coordinating with the placement engine to simulate the deployment of the virtual infrastructure resources based on the events.

13. The method of claim 12, further comprising:
performing an initialization routine to initialize an event manager with the scenario data;
parsing the sequence of events from the scenario data;
passing a virtual machine requirement from an event to the placement engine; and
receiving a deployment instruction to simulate the deployment of at least one virtual infrastructure resource based on the event.

14. The method of claim 8, further comprising:
preparing a placement problem for the placement engine;
invoking an application program interface (API) between the simulation controller and the placement engine;
receiving a placement solution corresponding to the placement problem; and
extracting placement information from the placement solution.

15. A non-transitory computer-readable storage medium storing program instructions, wherein execution of the program instructions by one or more processors causes the one or more processors to perform operations comprising:
implementing a placement simulator to interface with a placement engine in a virtual machine environment;
at the placement simulator, receiving inventory and scenario data for a simulated virtual datacenter, wherein the inventory data specifies instances of inventory objects and virtual resource connectivity among the inventory objects, wherein the scenario data comprises a sequence of events, and wherein the events include interactions between the inventory objects, at least one of the events is a deploy event being marked with a timestamp, a virtual machine deploy action and resource requirements for a virtual machine being deployed;
parsing the sequence of events in the scenario data;
storing the sequence of events in a priority event queue in chronological order;
invoking event handlers for the sequence of events from the scenario data stored in the priory event queue so that the sequence of events are executed in the chronological order, wherein the deploy event is executed to simulate the virtual machine deploy action of the virtual machine using the placement engine; and
populating the simulated virtual datacenter using the inventory data and simulating deployment of virtual infrastructure resources in the simulated virtual datacenter by the placement engine.

16. The non-transitory computer-readable storage medium of claim 15, wherein the operations further comprise:
coordinating with the placement engine to simulate the deployment of the virtual infrastructure resources based on the sequence of the events.

17. The non-transitory computer-readable storage medium of claim 15, wherein the operations further comprise:
compiling placement engine and placement simulator modules; and
simulating multiple test scenarios on the placement engine using a single compilation of the placement engine and the placement simulator modules.

18. The non-transitory computer-readable storage medium of claim 15, wherein the operations further comprise:
maintaining states of the inventory objects over the sequence of the events; and
generating a visualization of the states of the inventory objects over the sequence of the events to facilitate inspection of the states of the inventory objects over the sequence of the events.

19. The non-transitory computer-readable storage medium of claim 15, wherein the operations further comprise:
based on the simulated deployment of the virtual infrastructure resources in the simulated virtual datacenter, deploying the virtual infrastructure resources in a physical infrastructure.

\* \* \* \* \*